United States Patent
Patel

(10) Patent No.: US 12,028,022 B2
(45) Date of Patent: Jul. 2, 2024

(54) HYBRID POWER AMPLIFIER WITH GAN-ON-SI AND GAN-ON-SIC CIRCUITS

(71) Applicant: MACOM Technology Solutions Holdings, Inc., Lowell, MA (US)

(72) Inventor: Prity Kirit Patel, Cary, NC (US)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 328 days.

(21) Appl. No.: 17/117,332

(22) Filed: Dec. 10, 2020

(65) Prior Publication Data

US 2022/0190785 A1  Jun. 16, 2022

(51) Int. Cl.
| H03F 1/02 | (2006.01) |
| H01L 23/66 | (2006.01) |
| H03F 3/195 | (2006.01) |
| H03F 3/24 | (2006.01) |

(52) U.S. Cl.
CPC ........... *H03F 1/0288* (2013.01); *H01L 23/66* (2013.01); *H03F 3/195* (2013.01); *H03F 3/245* (2013.01); *H01L 2223/6655* (2013.01); *H03F 2200/451* (2013.01)

(58) Field of Classification Search
CPC .................................................. H03F 1/0288
See application file for complete search history.

(56) References Cited

U.S. PATENT DOCUMENTS

| 4,375,054 A | 2/1983 | Pavio |
| 6,085,074 A | 7/2000 | Cygan |
| 6,262,629 B1 | 7/2001 | Stengel et al. |
| 6,649,287 B2 | 11/2003 | Weeks et al. |
| 6,791,417 B2 | 9/2004 | Pengelly et al. |
| 7,078,976 B2 | 7/2006 | Blednov |
| 7,109,790 B2 | 9/2006 | Kwon et al. |
| 7,218,175 B1 | 5/2007 | Kobayashi |
| 7,414,478 B2 | 8/2008 | Elmala et al. |
| 7,541,866 B2 | 6/2009 | Bowles et al. |
| 7,602,241 B2 | 10/2009 | Suzuki et al. |

(Continued)

FOREIGN PATENT DOCUMENTS

| CN | 101494439 A | 7/2009 |
| CN | 102137518 A | 7/2011 |

(Continued)

OTHER PUBLICATIONS

Andrei Grebennikov, "A high-efficiency 100-W four-stage Doherty GaN HEMT power amplifier module for WCDMA systems", 2011 IEEE MTT-S International Microwave Symposium.

(Continued)

*Primary Examiner* — Patricia T Nguyen

(74) *Attorney, Agent, or Firm* — Perilla Knox & Hildebrandt LLP; Jason M. Perilla

(57) ABSTRACT

A power amplifier, such as a radio-frequency (RF) Doherty power amplifier, for amplifying an input signal to an output signal is disclosed. The power amplifier includes a peaking amplifier circuit, where the peaking amplifier circuit is formed in gallium nitride materials on a silicon substrate. The power amplifier further includes a main amplifier circuit, where the main amplifier circuit is formed in gallium nitride materials on a silicon carbide substrate.

20 Claims, 2 Drawing Sheets

(56) References Cited

U.S. PATENT DOCUMENTS

| | | | |
|---|---|---|---|
| 7,663,434 | B2 | 2/2010 | Yang et al. |
| 7,876,159 | B2 | 1/2011 | Wang et al. |
| 7,973,600 | B2 | 7/2011 | Yu |
| 8,237,498 | B2 | 8/2012 | Kato et al. |
| 8,358,174 | B2 | 1/2013 | Kim et al. |
| 8,395,450 | B2 | 3/2013 | Deguchi et al. |
| 8,466,746 | B2 | 6/2013 | Jeong et al. |
| 8,487,703 | B2 | 7/2013 | Blednov |
| 9,071,211 | B1 | 6/2015 | Ozard |
| 9,083,284 | B2 | 7/2015 | Maslennikov et al. |
| 9,331,638 | B2 | 5/2016 | Chen et al. |
| 9,531,329 | B2 | 12/2016 | Tanimoto |
| 9,543,914 | B2 | 1/2017 | Bouny |
| 9,621,115 | B1 | 4/2017 | Wu |
| 9,667,199 | B1 | 5/2017 | McLaren |
| 9,673,766 | B1 | 6/2017 | Roberts et al. |
| 9,774,301 | B1* | 9/2017 | Maalouf ............ H01L 23/49838 |
| 9,813,036 | B2 | 11/2017 | Folkmann et al. |
| 9,966,903 | B1 | 5/2018 | McLaren et al. |
| 10,211,785 | B2 | 2/2019 | McLaren |
| 10,284,146 | B2 | 5/2019 | Wu et al. |
| 10,284,147 | B2 | 5/2019 | Wu et al. |
| 10,305,437 | B2 | 5/2019 | Ozard et al. |
| 11,018,629 | B2 | 5/2021 | Min et al. |
| 11,050,389 | B2 | 6/2021 | Cassou et al. |
| 11,159,125 | B2 | 10/2021 | Bouisse et al. |
| 11,190,143 | B2 | 11/2021 | Pham et al. |
| 11,233,483 | B2 | 1/2022 | Bouisse et al. |
| 11,245,363 | B2 | 2/2022 | Bouisse |
| 11,283,410 | B2 | 3/2022 | Bouisse |
| 11,496,098 | B2 | 11/2022 | Wang |
| 11,515,842 | B2 | 11/2022 | Wang et al. |
| 11,522,499 | B2 | 12/2022 | Hue et al. |
| 2003/0137346 | A1 | 7/2003 | Hellberg |
| 2003/0141933 | A1 | 7/2003 | Pengelly |
| 2005/0206462 | A1 | 9/2005 | McCorquodale et al. |
| 2006/0097783 | A1 | 5/2006 | Okubo et al. |
| 2006/0145757 | A1 | 7/2006 | Kim et al. |
| 2007/0205827 | A1 | 9/2007 | Mobbs |
| 2010/0315162 | A1 | 12/2010 | Gajadharsing et al. |
| 2011/0140775 | A1 | 6/2011 | Hong et al. |
| 2011/0193624 | A1 | 8/2011 | Scott et al. |
| 2011/0204980 | A1 | 8/2011 | Blednov |
| 2012/0025915 | A1 | 2/2012 | Ui |
| 2012/0092074 | A1 | 4/2012 | Yanduru et al. |
| 2012/0105147 | A1 | 5/2012 | Harris et al. |
| 2012/0319780 | A1 | 12/2012 | Wilson et al. |
| 2013/0093534 | A1 | 4/2013 | Mei |
| 2013/0154729 | A1 | 6/2013 | Folkmann et al. |
| 2014/0118070 | A1 | 5/2014 | Wilson et al. |
| 2014/0132343 | A1 | 5/2014 | Colantonio et al. |
| 2014/0146917 | A1 | 5/2014 | Muhammad |
| 2014/0218116 | A1 | 8/2014 | Cui et al. |
| 2015/0002227 | A1 | 1/2015 | Pribble et al. |
| 2015/0002230 | A1 | 1/2015 | Qureshi |
| 2015/0091651 | A1 | 4/2015 | Seneviratne et al. |
| 2015/0155838 | A1 | 6/2015 | Embar et al. |
| 2015/0180428 | A1 | 6/2015 | Pham et al. |
| 2016/0036398 | A1 | 2/2016 | Li |
| 2016/0268976 | A1 | 9/2016 | Negra et al. |
| 2016/0336903 | A1 | 11/2016 | Ahmed et al. |
| 2017/0016322 | A1 | 1/2017 | Hagenbuch |
| 2017/0019071 | A1 | 1/2017 | Kobayashi et al. |
| 2017/0070193 | A1 | 3/2017 | Juang et al. |
| 2017/0085228 | A1 | 3/2017 | Abdo et al. |
| 2017/0163221 | A1 | 6/2017 | Takagi et al. |
| 2018/0026583 | A1 | 1/2018 | Yanduru et al. |
| 2018/0034418 | A1 | 2/2018 | Blednov |
| 2018/0034419 | A1 | 2/2018 | Moronval |
| 2018/0183388 | A1 | 6/2018 | Pham |
| 2018/0191309 | A1 | 7/2018 | McLaren |
| 2018/0233578 | A1 | 8/2018 | Shi et al. |
| 2018/0248521 | A1* | 8/2018 | Min ........................ H03F 3/213 |
| 2018/0254748 | A1 | 9/2018 | Grebennikov et al. |
| 2019/0027442 | A1* | 1/2019 | Ercoli ............... H01L 23/49503 |
| 2019/0036487 | A1 | 1/2019 | Jiang |
| 2019/0333878 | A1* | 10/2019 | Wu ...................... H01L 23/5383 |
| 2019/0356277 | A1 | 11/2019 | Bouisse et al. |
| 2020/0212847 | A1 | 7/2020 | Pham et al. |
| 2021/0013572 | A1 | 1/2021 | Zhu |
| 2021/0013836 | A1* | 1/2021 | Bouisse .................. H03F 1/565 |
| 2021/0175854 | A1* | 6/2021 | Hue ........................ H03F 3/195 |
| 2022/0085772 | A1* | 3/2022 | Holmes .................. H03F 3/195 |
| 2022/0123693 | A1* | 4/2022 | Wang ..................... H03F 1/565 |

FOREIGN PATENT DOCUMENTS

| | | |
|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104704747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 B1 | 4/2012 |
| EP | 2458730 A1 | 5/2012 |
| EP | 2698918 A1 | 2/2014 |
| EP | 2806557 A1 | 11/2014 |
| EP | 2876810 A1 | 5/2015 |
| EP | 3121960 A1 | 1/2017 |
| EP | 3133735 A1 | 2/2017 |
| EP | 3179628 A2 | 6/2017 |
| EP | 3179638 A1 | 6/2017 |
| EP | 3054589 B1 | 7/2018 |
| JP | 2012222624 A | 11/2012 |
| TW | 1336996 B | 2/2011 |
| TW | 1377783 B | 11/2012 |
| TW | 1462469 B | 11/2014 |
| TW | 201611514 A | 3/2016 |
| WO | 2009027916 A2 | 3/2009 |
| WO | 2015176077 A2 | 11/2015 |
| WO | 2017192075 A1 | 11/2017 |
| WO | 2018142176 A1 | 8/2018 |
| WO | 2018142177 A1 | 8/2018 |
| WO | 2018142178 A1 | 8/2018 |
| WO | 2018197917 A1 | 11/2018 |
| WO | 2018197918 A1 | 11/2018 |
| WO | 2018197919 A1 | 11/2018 |
| WO | 2019036499 A1 | 2/2019 |
| WO | 2019069115 A1 | 4/2019 |
| WO | 2020072898 A1 | 4/2020 |
| WO | 2021137951 A1 | 7/2021 |

OTHER PUBLICATIONS

Barthwal Ayushi et al., "A Design Strategy for Bandwidth Enhancement in Three-Stage Doherty Power Amplifier With Extended Dynamic Range", IEEE Transactions on Microwave Theory and Techniques, Plenum, USA, vol. 66, No. 2, ISSN 0018-9480, Feb. 2018.

C.F. Campbell, "A fully integrated Ku-band Doherty amplifier MMIC", IEEE Microwave and Guided Wave Letters, (Mar. 1, 1999), vol. 9, No. 3, doi: 10.1109/75.761678, ISSN 1051-8207, pp. 114-116.

Camarchia et al., "7 GHz MMIC GaN Doherty Power Amplifier With 47% Efficiency at 7 dB Output Back-Off," IEEE Microwave and Wireless Components Letters. Jan. 2013.

Ceylan et al., "Refine Biasing Networks for High PA Low Frequency Stability," Microwave & RF, Apr. 17, 2018, pp. 1-6.

Cheng et al., "GaN HEMT Based Doherty Broadband Power Amplifier," Journal of Hangzhou Dianzi University (Natural Sciences), Mar. 15, 2017.

Cidronali et al., "Frequency Analysis and Multiline Implementation of Compensated Impedance Inverter for Wideband Doherty High-Power Amplifier Design," IEEE Transactions on Microwave Theory and Techniques. May 2016; 64(5):1359-72.

(56) References Cited

OTHER PUBLICATIONS

Daehyun Kang et al., "30.3% PAE HBT Doherty power amplifier for 2.5-2.7 GHZ mobile WiMAX," Microwave Symposium Digest (MTT), 2010 IEEE MTT-S International, IEEE, Piscataway, NJ, USA, Piscataway, NJ, USA , (May 23, 2010), ISBN 978-1-4244-6056-4, pp. 796-799.

Daekyu Yu et al., "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.

Daniel Popp et al., "High Power and High Bandwidth Digital Three-Way Doherty Power Amplifier", 2019 IEEE 20TH Wireless and Microwave Technology Conference (WAMICON), IEEE, (Apr. 8, 2019), doi: 10.1109/WAMICON.2019.8765455, pp. 1-6, XP033577671.

Grebennikov et al., "High-Efficiency Doherty Power Amplifiers: Historical Aspect and Modem Trends," Proceedings of the IEEE. Dec. 2012; 100(12):3190-219.

Kim et al., "Doherty Linear Power Amplifiers for Mobile Handset Applications. Proceedings of Asia-Pacific Microwave Conference," Dec. 2006; 1885-94.

Merrick B et al., "A wideband Sequential Power Amplifier", 2014 IEEE Mtt-S International Microwave Symposium (IMS2014), IEEE, (Jun. 1, 2014), doi:10.1109/MWSYM.2014.6848592, pp. 1-3, XP032615303.

Moronval et al., "A 100 W Multi-Band Four-Way Integrated Doherty Amplifier," IEEE MTT-S International Microwave Symposium (IMS) May 22, 2016: 1-3.

Quaglia et al., "K-Band GaAs MMIC Doherty Power Amplifier for Microwave Radio With Optimized Driver," IEEE Transactions on Microwave Theory and Techmques. Nov. 2014; 62(11):2518-25.

Roberts Michael James, "Understanding the 3 level Doherty", 2016 11TH European Microwave Integrated Circuits Conference (EUMIC), European Microwave Association, (Oct. 3, 2016), doi:10.1109/EUMIC.2016.7777583, pp. 428-432.

Vigneau et al., "Fully integrated three-way LDMOS Doherty PAs for 1.8-2.2 GHZ dual-band and 2.6 GHz m-MIMO 5G applications," Published in International Journal of Microwave and Wireless Technologies, Mar. 1, 2021.

Wicks B et al., "A 60-GHz fully-integrated Doherty power amplifier based on 0.13-um CMOS process," Radio Frequency Integrated Circuits Symposium, 2008. RFIC 2008. IEEE, IEEE, Piscataway, NJ, USA, (Jun. 17, 2008), ISBN 978-1-4244-1808-4, pp. 69-72.

Xia Jing et al., "Improved Three-Stage Doherty Amplifier Design With Impedance Compensation in Load Combiner for Broadband Applications", IEEE Transactions On Microwave Theory and Techniques, Plenum, USA, vol. 67, No. 2, doi:10.1109/TMTT.2018.2884404, ISSN 0018-9480, (Feb. 1, 2019), pp. 778-786.

Yu et al., "Fully Integrated Doherty Power Amplifiers for 5 GHz Wireless-LANs," IEEE Radio Frequency Integrated Circuits Symposium (RFIC). Jun. 11, 2006; 153-6.

Zhou et al., "Design of an S-Band Two-Way Inverted Asymmetrical Doherty Power Amplifier for Long Term Evolution Applications," Progress in Electromagnetics Research Letters. 2013; 39:73-80.

\* cited by examiner

US 12,028,022 B2

HYBRID POWER AMPLIFIER WITH GAN-ON-SI AND GAN-ON-SIC CIRCUITS

BACKGROUND

High-speed power amplifiers formed from semiconductor materials have a variety of useful applications, such as radio-frequency (RF) communications, radar, RF energy, power conversion, and microwave applications. Supporting mobile communications under current and proposed communication standards, such as WiMax, 4G, and 5G, can place high performance demands on high-speed amplifiers constructed from semiconductor transistors. The amplifiers may need to meet performance specifications related to output power, signal linearity, signal gain, bandwidth, and efficiency, among others.

Efficient, high-speed, broadband, high-power amplifiers can be constructed from multiple transistors operating in parallel circuit paths and formed from semiconductor materials such as, but not limited to, gallium nitride (GaN) materials. GaN materials have received appreciable attention in recent years because of the desirable electronic and electro-optical properties of the materials. Because of their wide bandgap, GaN materials are useful for high-speed, high-voltage, and high-power applications.

BRIEF SUMMARY OF THE INVENTION

Various embodiments are disclosed for amplifying radio-frequency signals. In a first aspect, a power amplifier for amplifying an input signal to an output signal is disclosed. The power amplifier includes a peaking amplifier circuit and a main amplifier circuit. The power amplifier may be a radio frequency (RF) Doherty power amplifier in some embodiments. The peaking amplifier circuit is formed in GaN materials on a silicon substrate. The main amplifier circuit is formed in GaN materials on a silicon carbide substrate. The power amplifier may be implemented in a single package, such as a dual flat no-lead (DFN) package or a quad flat no-lead (QFN) package.

In some embodiments, the single package further includes a pre-driver amplifier circuit that feeds the main amplifier circuit and the peaking amplifier circuit. The pre-driver amplifier circuit may be formed in gallium nitride materials on a silicon substrate.

In a second aspect, a Doherty power amplifier for amplifying an input signal to an output signal is disclosed. The Doherty power amplifier includes a peaking amplifier circuit and a main amplifier circuit. The peaking amplifier circuit may be formed in gallium nitride materials on a silicon substrate. The main amplifier circuit may be formed in gallium nitride materials on a silicon carbide substrate. The Doherty power amplifier may be implemented in a single package, such as a dual flat no-lead (DFN) package or a quad flat no-lead (QFN) package.

In some embodiments, the single package further includes a pre-driver amplifier circuit that feeds the main amplifier circuit and the peaking amplifier circuit. The pre-driver amplifier circuit may be formed in GaN materials on a silicon substrate. In some embodiments, the pre-driver amplifier circuit is formed on a separate die relative to the peaking amplifier circuit.

In a third aspect, a method for amplifying an input signal to an output signal is disclosed. The method includes forming a peaking amplifier circuit in GaN materials on a silicon substrate, forming a main amplifier circuit in GaN materials on a silicon carbide substrate, and implementing or providing the peaking amplifier circuit and the main amplifier circuit in a single package. The single package may include a dual flat no-lead (DFN) package or a quad flat no-lead (QFN) package, for example.

In some embodiments, the method further includes forming a pre-driver amplifier circuit in GaN materials on a silicon substrate and providing the pre-driver amplifier circuit in the single package. The pre-driver amplifier feeds the main amplifier circuit and the peaking amplifier circuit. At least the peaking amplifier circuit and the main amplifier circuit together form a Doherty power amplifier.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
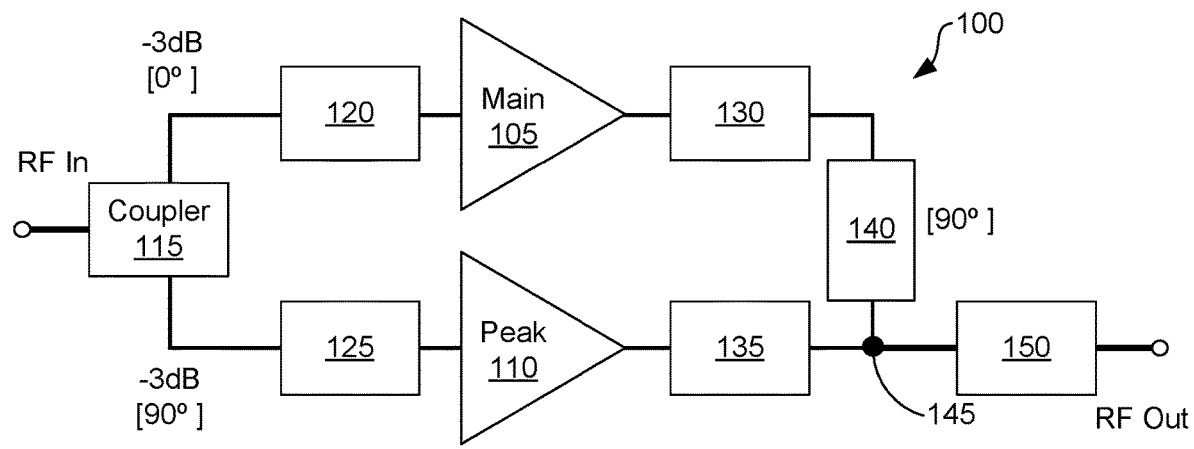
FIG. 1 is a simplified circuit diagram of a Doherty power amplifier in the related art.

Due to the wide bandgap of gallium nitride (GaN) materials, GaN materials tend to be more resistant to avalanche breakdown and can maintain electrical performance at higher temperatures than other semiconductors. GaN, for example, also has a higher carrier saturation velocity compared to silicon, is a very stable and hard material, has a high thermal conductivity, and has a higher melting point than other conventional semiconductors such as silicon, germanium, and gallium arsenide. Thus, GaN materials have been useful for manufacturing high-speed, high-voltage, and high-power active devices. For example, GaN materials are useful in semiconductor power amplifiers for radio frequency (RF) communications, radar, RF energy, and microwave applications.

Applications supporting mobile communications and wireless internet access, for example, place high performance demands on high-speed RF amplifiers constructed from semiconductor transistors. The amplifiers may need to meet performance specifications related to output power, signal linearity, signal gain, bandwidth, and efficiency. One approach to amplifying signals for communications is to use a Doherty power amplifier.

A Doherty power amplifier can include multiple amplifiers operating in parallel in different amplification classes that provide amplified signals to a common output. A main amplifier circuit can amplify signals at low signal levels and high signal levels. Secondary amplifiers can be idle (non-amplifying) at low signal levels and become active (amplifying) as signal levels increase.

A traditional Doherty power amplifier utilizes two transistors, a main or carrier transistor and a peaking or auxiliary transistor. The main transistor is typically designed to operate linearly and efficiently over a wide range of input powers and designed to dissipate a relatively large amount of power.

The peaking transistor, on the other hand, is designed to operate at relatively higher input powers and is designed to dissipate a relatively small amount of power. These differing requirements result in different transistor characteristic layouts between the main and peaking transistors in a Doherty power amplifier.

For example, the main transistor may have a moderate or nominal periphery to operate well at lower power, while having a relatively larger gate pitch to present a better thermal environment for power dissipation. The peaking transistor, on the other hand, may have a relatively larger periphery for higher power, while having a relatively smaller gate pitch, as it does not need to dissipate very much power. Traditionally, integrated power amplifiers and, more specifically, Doherty power amplifiers in single packages utilize a main transistor and a peaking transistor both formed of GaN materials on silicon (GaN-on-Si) or, alternatively, a main transistor and a peaking transistor both formed of GaN materials on silicon carbide (GaN-on-SiC).

In this context, the present disclosure relates to a hybrid power amplifier with both GaN-on-Si and GaN-on-SiC circuits integrated in a common package. In accordance with various embodiments, a power amplifier for amplifying an input signal to an output signal is disclosed that includes a peaking amplifier circuit and a main amplifier circuit. The power amplifier may be a Doherty power amplifier in some embodiments. The peaking amplifier circuit is formed in GaN materials on a silicon substrate. The main amplifier circuit is formed in GaN materials on a silicon carbide substrate.

The power amplifier may be implemented in a single package, such as a dual flat no-lead (DFN) package or a quad flat no-lead (QFN) package, although other types of packages can be used. Further, in some embodiments, the single package further includes a pre-driver amplifier circuit that feeds the main amplifier circuit and the peaking amplifier circuit. The pre-driver amplifier circuit may also be formed in GaN materials on a silicon substrate.

In accordance with various embodiments, a Doherty power amplifier for amplifying an input signal to an output signal is disclosed. The Doherty power amplifier includes a peaking amplifier circuit and a main amplifier circuit. The peaking amplifier circuit may be formed in GaN materials on a silicon substrate. The main amplifier circuit may be formed in GaN materials on a silicon carbide substrate.

The Doherty power amplifier may be implemented in a single package, such as a dual flat no-lead (DFN) package or a quad flat no-lead (QFN) package. Further, in some embodiments, the single package further includes a pre-driver amplifier circuit that feeds the main amplifier circuit and the peaking amplifier circuit. The pre-driver amplifier circuit may be formed in GaN materials on a silicon substrate.

The embodiments described herein provide improvements in performance as compared to traditional Doherty power amplifiers. Notably, a main amplifier circuit formed in GaN materials on a silicon carbide substrate may provide improved RF performance, overtemperature performance, and general Doherty power amplifier performance when compared to a traditional Doherty power amplifier. The peaking amplifier circuit being formed in GaN materials on a silicon substrate may provide better signal linearity when compared to a traditional Doherty power amplifiers, such as those that utilize a main amplifier circuit and a peaking amplifier circuit formed in the same semiconductor materials on the same type of substrate.

One approach to amplifying signals to high power levels for wireless communications, for example, is to use a Doherty power amplifier. An example of a Doherty power amplifier is depicted schematically in FIG. 1. To aid in understanding the present technology, a brief summary of Doherty power amplifiers is provided.

A Doherty power amplifier 100 may include a main power amplifier 105 and a peaking power amplifier 110 that operate in parallel on a signal divided into parallel circuit branches. The peaking amplifier 110 is typically idle (not amplifying) at low signal levels and turns on when the main amplifier 105 begins to saturate. Outputs from the two amplifiers are subsequently combined into a single output.

A 90-degree power coupler 115 divides a received RF input signal into two outputs that connect to the main power amplifier 105 and the peaking power amplifier 110. The power coupler 115 also delays the phase of the signal provided to the peaking power amplifier 110 by approximately 90 degrees with respect to the phase of the signal provided to the main power amplifier 105. Impedance-matching components 120, 125 may be placed before the main power amplifier 105 and the peaking power amplifier 110. These impedance-matching components can transform the impedance so as to match input impedances of the main power amplifier 105 and the peaking power amplifier 110 to the impedances of the transmission lines connected to the amplifier inputs or to output impedances from the 90-degree coupler 115. Such impedance matching can reduce undesirable effects of signal reflections from the amplifiers.

Additional impedance-matching components 130, 135 may be located at the outputs of the main power amplifier 105 and the peaking power amplifier 110, for instance, to match impedances between the output of the main power amplifier 105 and the input of an impedance inverter 140 (which may be 50 ohms by design, for example) and between the output of the peaking power amplifier 110 and an impedance at a combining node 145 (which may also be 50 ohms, for example).

The impedance inverter 140 rotates the phase of the signal received from the main power amplifier 105 by approximately 90 degrees so that the signals from the main power amplifier 105 and the peaking power amplifier 110 will be essentially in phase at the combining node 145. An output impedance-matching element 150 may be used between the combining node 145 and the RF output to match the output impedance of the Doherty power amplifier 100 to an impedance of a load (not shown).

In a symmetric type of Doherty power amplifier 100, the main power amplifier 105 and the peaking power amplifier 110 may be closely similar or identical semiconductor devices. For example, the main power amplifier 105 and the peaking power amplifier 110 may handle a same amount of signal power and amplify a signal to a same power level when both amplifiers are fully on and amplifying at their upper limit. Because the input signal is split equally to the two amplifiers, the signals to the main power amplifier 105 and the peaking power amplifier 110 are typically reduced by 3 dB at each output port of the coupler 115 compared to the input RF signal due to the splitting. Signal values expressed in "dB" refer to relative power levels.

Figure 2:
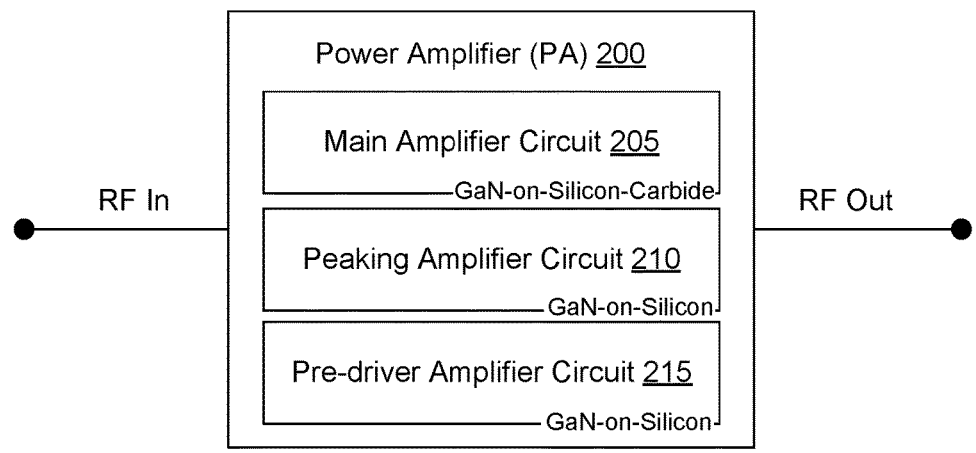
FIG. 2 is a schematic diagram of a power amplifier in accordance with various embodiments of the present disclosure.

Referring next to FIG. 2, a schematic diagram of a power amplifier 200 is shown in accordance with various embodiments. According to example shown in FIG. 2, the schematic diagram may be relied upon to implement the Doherty power amplifier 100 of FIG. 1. The power amplifier 200 includes a main power amplifier circuit 205 and a peaking amplifier circuit 210.

The main amplifier circuit 205 may correspond to the main power amplifier 105 of the Doherty power amplifier 100 of FIG. 1, whereas the peaking power amplifier 110 may correspond to the peaking power amplifier 110 of FIG. 1. As such, the peaking amplifier circuit 210 is typically idle (not amplifying) at low signal levels, and turns on when the main amplifier circuit 205 begins to saturate. Outputs from the two amplifiers are subsequently combined into a single RF output.

In various embodiments, the main amplifier circuit 205 is formed in GaN materials on a silicon carbide substrate, whereas the peaking amplifier circuit 210 is formed in GaN materials on a silicon substrate. As may be appreciated, this varied configuration may provide improved RF performance, overtemperature performance, and general Doherty power amplifier performance when compared to a Doherty power amplifier that utilizes a main amplifier circuit and a peaking amplifier circuit formed in the same type of semiconductor materials on the same type of substrate.

In some embodiments, the power amplifier 200 may include a pre-driver amplifier circuit 215 for feeding the main amplifier circuit 205 and the peaking amplifier circuit 215. In some embodiments, the pre-driver amplifier circuit 215 is formed in GaN materials on a silicon substrate.

In other embodiments, the power amplifier 200 does not include the pre-driver amplifier circuit 215. Instead, the power amplifier 200 may be disposed on a printed circuit board (PCB) where the pre-driver amplifier circuit 215 is positioned on the PCB having an output coupled to an RF input of the power amplifier 200, where the output of the pre-driver amplifier circuit 215 feeds the main amplifier circuit 205 and/or the peaking amplifier circuit 210.

Figure 3:
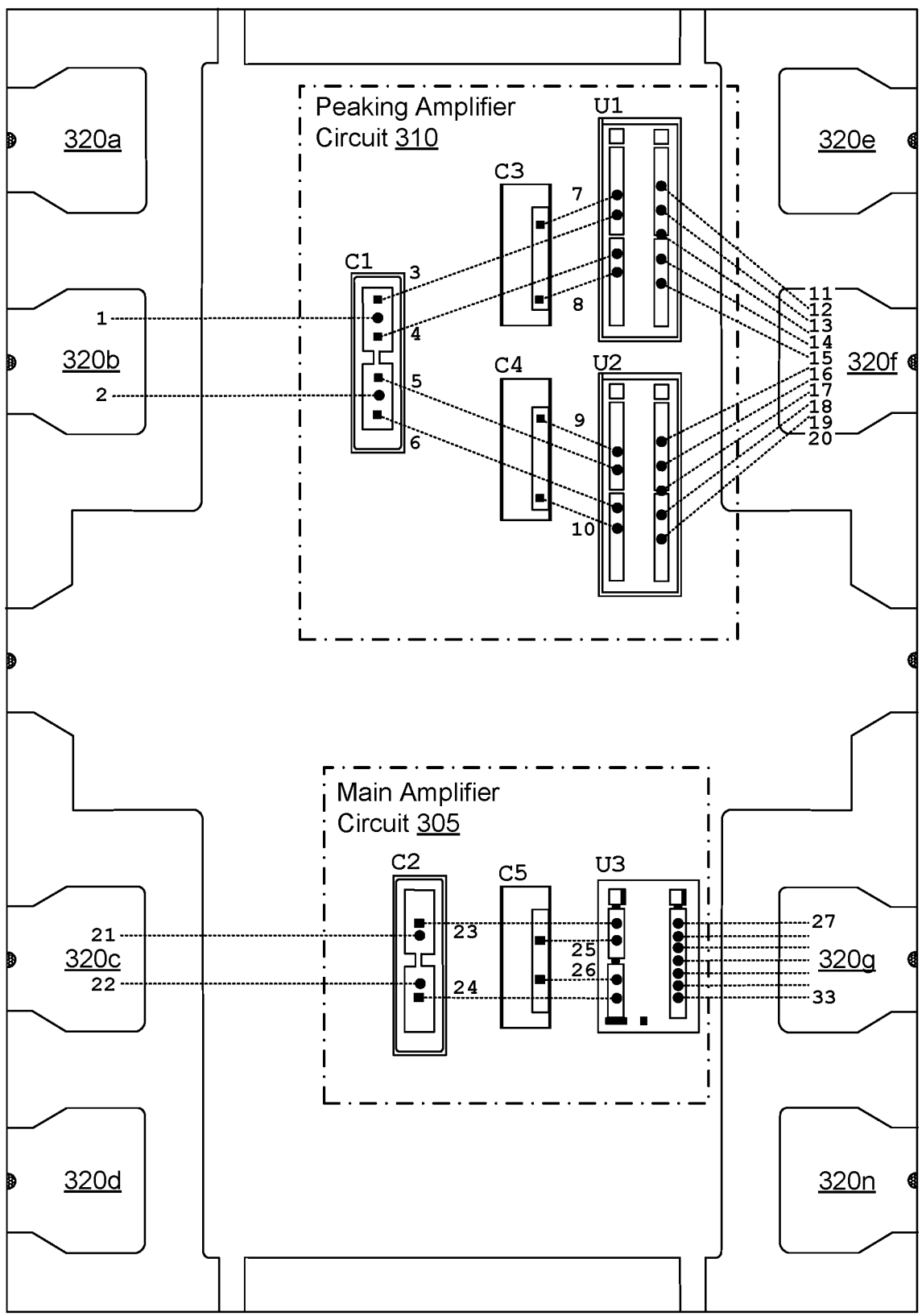
FIG. 3 is a package layout for a power amplifier package that includes a main amplifier circuit and a peaking amplifier circuit in accordance with various embodiments of the present disclosure.

Turning now to FIG. 3, a package layout is shown having a package 300 in accordance with various embodiments. Generally, the package 300 includes a power amplifier implemented in a single package. For instance, according to example shown in FIG. 3, the package 300 may be relied upon to implement the Doherty power amplifier 100 shown in FIG. 1. As such, the package 300 includes a main power amplifier circuit 305 and a peaking amplifier circuit 310. In some embodiments, the main power amplifier circuit 305 is a first type of semiconductor device and the peaking amplifier circuit 310 is a second, different type of semiconductor device. The package 300 may include a package, such as a dual flat no-lead (DFN), a quad flat no-lead (QFN), or other suitable device package, for placement on a PCB or in an integrated circuit, for example.

In some embodiments, the package 300 may include a square-shaped or rectangular surface-mount plastic package, for instance, with no leads. As such, the package 300 may include metal pads 320a . . . 320n along the top, bottom, and/or sides of the bottom of the package 300 that act as I/O pins or other electrical connection points. In the example of FIG. 3, there are eight metal pads 320. However, it is understood that another number of metal pads 320 may be employed depending on a particular application. Further, the package 300 may include a laminate where the main amplifier circuit 305, the peaking amplifier circuit 310, and the laminate are provided in the package 300. The package 300 of FIG. 3 is shown as a flat no-leads packages, such as a DFN package that physically and electrically connects an integrated circuit to a PCB. However, in alternative embodiments, the package 300 may include a QFN package or other suitable package.

Referring now to the main amplifier circuit 305 of the package 300, the main amplifier circuit 305 includes, for example, a plurality of capacitors C2, C5, as well as one or more dies U3. The capacitors C2, C5 may perform input impedance matching similar to impedance-matching components 120 described above with respect to FIG. 1. In various embodiments, the die U3 of the main amplifier circuit 305 may include one or more GaN-on-SiC transistors or integrated circuits.

The peaking amplifier circuit 310 includes a plurality of capacitors C1, C3, and C4, as well as a plurality of dies U1, U2. The capacitors C1, C3, and C4 may perform input impedance matching similar to impedance-matching components 125 described above with respect to FIG. 1. In various embodiments, the dies U1, U2 of the peaking amplifier circuit 310 may include one or more GaN-on-Si transistors or integrated circuits.

In various embodiments, the main amplifier circuit 305 is formed in GaN materials on a silicon carbide substrate, whereas the peaking amplifier circuit 310 is formed in GaN materials on a silicon substrate. As may be appreciated, the use of different substrates among the main and peaking amplifiers may provide improved RF performance, overtemperature performance, and general power amplifier performance as compared to using substrates of the same semiconductor materials.

Also, a peaking amplifier circuit 310 formed in GaN materials on a silicon substrate may provide better signal linearity as compared to a peaking amplifier circuit 310 formed in GaN materials on a silicon carbide substrate.

In further embodiments, the package 300 may include a pre-driver amplifier circuit (not shown) configured to feed the main amplifier circuit 305 and the peaking amplifier circuit 310. In some embodiments, the pre-driver amplifier circuit is formed in GaN materials on a silicon substrate. As may be appreciated, additional I/O pins of the package 300 may be provided in addition to those shown in FIG. 3 to account for the pre-driver amplifier circuit.

In some embodiments, the main amplifier circuit 305 is a main amplifier transistor and the peaking amplifier circuit 310 is a peaking amplifier transistor. The main amplifier transistor may be formed as a GaN-on-Si transistor, whereas the peaking amplifier transistor may be formed as a GaN-on-SiC transistor. As such, the package 300 includes at least a silicon substrate and a silicon carbide substrate (e.g., semiconductor material wafers) which are distinct from one another. While the main amplifier circuit 305 is shown on a bottom of the package layout and the peaking amplifier circuit 310 is shown on a top of the package layout, it is understood that the peaking amplifier circuit 310 may be positioned on the bottom and the main amplifier circuit 305 may be positioned on the top of the package layout depending on a desired application.

The main amplifier transistor and the peaking amplifier transistor may also be formed as GaN materials transistors formed on other suitable types of substrates. In other examples, the transistors can be formed as other group III-Nitrides or group III-V direct bandgap active semiconductor devices (e.g., GaAs, InP, InGaP, AlGaAs, etc. devices). The devices can be formed as enhancement mode HEMT, pHEMT, or mHEMT devices. In other cases, the concepts described herein can be relied upon for use with depletion mode devices with certain design changes. The concepts are not limited to group III-V semiconductor devices, however, as the concepts can be applied to other semiconductor materials and processing technologies. Thus, while the concepts can be particularly beneficial for use with power transistors formed from GaN materials for amplifiers, the concepts can also be relied upon when forming other active devices using other semiconductor materials and processes for other types of circuits.

As used herein, the phrase "gallium nitride materials" or "GaN materials" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than five percent by weight). The term "gallium nitride" or GaN semiconductor refers directly to gallium nitride, exclusive of its alloys.

In certain embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped. Example gallium-nitride materials are described in U.S. Pat. No. 6,649,287 entitled "Gallium Nitride Materials and Methods" to Weeks, Jr., which is incorporated herein by reference in its entirety.

As used herein, a silicon substrate refers to a substrate that includes a silicon surface. Some examples of silicon substrates include substrates that are composed wholly of silicon (e.g., bulk silicon wafers), silicon-on-insulator (SOI) substrates, silicon-on-sapphire substrate (SOS), and SIMOX substrates, amongst others. Example silicon substrates also include substrates that have a silicon wafer bonded to another material such as diamond, AlN, or other polycrystalline materials. Silicon substrates having different crystallographic orientations may be employed.

As used herein, a silicon carbide substrate refers to a substrate that includes a silicon carbide surface. Examples of silicon carbide substrates include substrates that are composed entirely of silicon carbide (e.g., bulk silicon carbide wafers), silicon carbide composite wafers (e.g., wafers comprising a silicon carbide layer and a second layer of a material that is not silicon carbide), and the like.

In certain embodiments, the silicon substrate and/or the silicon carbide substrate may have various device layers, homojunctions, heterojunctions, or circuit layers embedded in the substrate, or formed on the front-side or back-side of the substrate. Such substrates may be semi-spec standard thickness, or thicker, or in some implementations thinner than semi-spec standards. In additional embodiments, the substrate may include a textured surface or may have a non-planar surface. The silicon substrate and/or the silicon carbide substrate may also have any of a variety of suitable thicknesses. According to certain embodiments, the thickness of the substrate may be selected based on the final device and heteroepitaxial specifications (e.g., wafer warp and bow), for example, as needed for successful high yielding semiconductor fabrication.

In some embodiments, the substrate comprises at least a layer having a high resistivity. For example, in certain embodiments in which silicon substrates are used, the silicon substrate (or at least the silicon portion of the substrate for substrates that include a silicon portion formed on another material) is highly resistive. According to certain embodiments, the substrate comprises at least a layer having a resistivity of greater than or equal to about 102 Ohms-cm (or greater than or equal to about 104 Ohms-cm, or greater than or equal to about 105 Ohms-cm). For example, in certain embodiments in which silicon substrates are used, the resistivity of the silicon substrate (or the silicon portion of the substrate) may be greater than or equal to about 102 Ohms-cm (or greater than or equal to about 104 Ohms-cm, or greater than or equal to about 105 Ohms-cm). In certain embodiments, the resistivity of the surface region of the substrate may be greater than or equal to about 102 Ohms-cm (or greater than or equal to about 104 Ohms-cm, or greater than or equal to about 105 Ohms-cm). Highly resistive substrates comprising silicon (e.g., silicon substrates or other substrates comprising silicon) may be particularly useful in some (but not necessarily all) structures that are used to form devices that operate at high frequencies (e.g., RF devices). According to certain embodiments, the high resistivity can reduce so-called substrate losses which otherwise may arise and sacrifice performance.

Accordingly, various embodiments are described for a package 300 that includes a fully integrated Doherty power amplifier module designed for wireless infrastructure applications that demand high performance. As such, the package 300 described herein may be implemented in massive multiple input, multiple output (MIMO) systems, outdoor small cells and low-power remote radio heads, as well as LTE systems.

In accordance with one or more embodiments, a method for amplifying an input signal to an output signal is disclosed. The method includes forming the peaking amplifier circuit 310 in GaN materials on a silicon substrate, forming the main amplifier 305 circuit in GaN materials on a silicon carbide substrate; and implementing or otherwise providing the peaking amplifier circuit 310 and the main amplifier circuit 305 in a single package 300. The single package 300 may include a dual flat no-lead (DFN) package or a quad flat no-lead (QFN) package, for example.

In some embodiments, the method further includes forming a pre-driver amplifier circuit 215 in GaN materials on a silicon substrate and providing the pre-driver amplifier circuit 215 in the single package 300 such that the pre-driver amplifier circuit 215 feeds the main amplifier circuit 305 and the peaking amplifier circuit 310. At least the peaking amplifier circuit 210 and the main amplifier circuit 205 may together form a Doherty power amplifier 100. In some embodiments, the pre-driver amplifier circuit 215 is formed on a separate die relative to the peaking amplifier circuit 310.

The features, structures, or characteristics described above may be combined in one or more embodiments in any suitable manner, and the features discussed in the various embodiments are interchangeable, if possible. In the following description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

Although the relative terms such as "on," "below," "upper," and "lower" are used in the specification to describe the relative relationship of one component to another component, these terms are used in this specification for convenience only, for example, as a direction in an example shown in the drawings. It should be understood that if the device is turned upside down, the "upper" component described above will become a "lower" component. When a structure is "on" another structure, it is possible that the structure is integrally formed on another structure, or that the structure is "directly" disposed on another structure, or that the structure is "indirectly" disposed on the other structure through other structures.

In this specification, the terms such as "a," "an," "the," and "said" are used to indicate the presence of one or more elements and components. The terms "comprise," "include," "have," "contain," and their variants are used to be open ended, and are meant to include additional elements, components, etc., in addition to the listed elements, components, etc. unless otherwise specified in the appended claims. The terms "first," "second," etc. are used only as labels, rather than a limitation for a number of the objects.

The above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A power amplifier for amplifying an input signal to an output signal, comprising:
   a peaking amplifier circuit, wherein the peaking amplifier circuit is formed in gallium nitride materials on a silicon substrate; and
   a main amplifier circuit, wherein the main amplifier circuit is formed in gallium nitride materials on a silicon carbide substrate.

2. The power amplifier according to claim 1, wherein the power amplifier is implemented in a single package.

3. The power amplifier according to claim 2, wherein the single package comprises a dual flat no-lead (DFN) package.

4. The power amplifier according to claim 2, wherein the single package comprises a quad flat no-lead (QFN) package.

5. The power amplifier according to claim 2, wherein the single package further comprises a pre-driver amplifier circuit that feeds the main amplifier circuit and the peaking amplifier circuit.

6. The power amplifier according to claim 5, wherein the pre-driver amplifier circuit is formed in gallium nitride materials on a silicon substrate, the pre-driver amplifier circuit being formed on a separate die relative to the peaking amplifier circuit.

7. The power amplifier according to claim 1, wherein the power amplifier is a Doherty power amplifier.

8. The power amplifier according to claim 1, wherein:
   the power amplifier is disposed on a printed circuit board (PCB); and
   a pre-driver amplifier circuit is positioned on the PCB having an output coupled to an input of the power amplifier, the output feeding the main amplifier circuit and the peaking amplifier circuit.

9. A Doherty power amplifier configured to amplify an input signal to an output signal, comprising:
   a peaking amplifier circuit, wherein the peaking amplifier circuit is formed in gallium nitride materials on a silicon substrate; and
   a main amplifier circuit, wherein the main amplifier circuit is formed in gallium nitride materials on a silicon carbide substrate.

10. The Doherty power amplifier according to claim 9, wherein the Doherty power amplifier is implemented in a single package.

11. The Doherty power amplifier according to claim 10, wherein the single package comprises a dual flat no-lead (DFN) package.

12. The Doherty power amplifier according to claim 10, wherein the single package comprises a quad flat no-lead (QFN) package.

13. The Doherty power amplifier according to claim 10, wherein the single package further comprises a pre-driver amplifier circuit that feeds the main amplifier circuit and the peaking amplifier circuit.

14. The Doherty power amplifier according to claim 13, wherein the pre-driver amplifier circuit is formed in gallium nitride materials on a silicon substrate, the pre-driver amplifier circuit being formed on a separate die relative to the peaking amplifier circuit.

15. The Doherty power amplifier according to claim 9, wherein:
   the Doherty power amplifier is disposed on a printed circuit board (PCB); and
   a pre-driver amplifier circuit is positioned on the PCB having an output coupled to an input of the RF power amplifier, the output feeding the main amplifier circuit and the peaking amplifier circuit.

16. A method for amplifying an input signal to an output signal, comprising:
   forming a peaking amplifier circuit in gallium nitride materials on a silicon substrate;
   forming a main amplifier circuit in gallium nitride materials on a silicon carbide substrate; and
   implementing the peaking amplifier circuit and the main amplifier circuit in a single package.

17. The method according to claim 16, wherein the single package comprises a dual flat no-lead (DFN) package or a quad flat no-lead (QFN) package.

18. The method according to claim 16, further comprising providing a pre-driver amplifier circuit in the single package that feeds the main amplifier circuit and the peaking amplifier circuit.

19. The method according to claim 18, further comprising forming the pre-driver amplifier circuit in gallium nitride materials on a silicon substrate, the pre-driver amplifier circuit being formed on a separate die relative to the peaking amplifier circuit.

20. The method according to claim 16, wherein at least the peaking amplifier circuit and the main amplifier circuit together form a Doherty power amplifier.

\* \* \* \* \*